(12) United States Patent
Abraham et al.

(10) Patent No.: US 12,150,390 B2
(45) Date of Patent: Nov. 19, 2024

(54) DOWNSTOP AND BUMP BONDS FORMATION ON SUBSTRATES

(71) Applicant: INTERNATIONAL BUSINESS MACHINES CORPORATION, Armonk, NY (US)

(72) Inventors: David Abraham, Croton, NY (US); John Michael Cotte, New Fairfield, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/871,887

(22) Filed: Jul. 22, 2022

(65) Prior Publication Data
US 2023/0363295 A1 Nov. 9, 2023

Related U.S. Application Data

(60) Provisional application No. 63/339,918, filed on May 9, 2022.

(51) Int. Cl.
*H10N 60/82* (2023.01)
*H10N 60/01* (2023.01)
*H10N 60/81* (2023.01)

(52) U.S. Cl.
CPC .......... *H10N 60/82* (2023.02); *H10N 60/01* (2023.02); *H10N 60/81* (2023.02)

(58) Field of Classification Search
CPC ........ H10N 60/82; H10N 60/01; H10N 60/81; H10N 69/00; G06N 10/40
See application file for complete search history.

(56) References Cited

U.S. PATENT DOCUMENTS

| 7,057,292 B1 | 6/2006 | Elenius et al. |
| 7,564,130 B1 | 7/2009 | Li |

(Continued)

FOREIGN PATENT DOCUMENTS

| CN | 109997156 A | 7/2019 |
| GB | 2062963 A | 5/1981 |

(Continued)

OTHER PUBLICATIONS

International Search Report and Written Opinion issued Aug. 8, 2023 in related International Patent Application No. PCT/IB2023/054690, 12 pgs.

(Continued)

*Primary Examiner* — Yasser A Abdelaziz
(74) *Attorney, Agent, or Firm* — Intelletek Law Group, PLLC; Gabriel Daniel, Esq.

(57) ABSTRACT

An electronic structure includes a first substrate having a first under bump metallization (UBM) region and a second UBM region formed thereon. One or more solder bumps is deposited onto the first UBM region. A downstop formed on the second UBM region is wider, shallower and more rigid than any one of the solder bumps formed on the first UBM region. A second substrate is joined to the first substrate by the one or more solder bumps located on the first UBM region, and a height of the downstop limits a distance between at least one of the first substrate and the second substrate, or between an object and at least one of the first substrate and the second substrate.

21 Claims, 5 Drawing Sheets

(56) References Cited

U.S. PATENT DOCUMENTS

| | | |
|---|---|---|
| 7,823,278 B2 | 11/2010 | Hougham et al. |
| 8,575,493 B1 | 11/2013 | Xu et al. |
| 8,686,560 B2 | 4/2014 | Parvarandeh et al. |
| 9,093,333 B1 | 7/2015 | Xu et al. |
| 9,099,318 B2 | 8/2015 | Chen |
| 9,971,970 B1 | 5/2018 | Rigetti et al. |
| 10,056,345 B2 * | 8/2018 | Kuo .................. H01L 23/49816 |
| 10,403,591 B2 | 9/2019 | Gandhi |
| 10,692,831 B1 | 6/2020 | Bronn et al. |
| 10,734,696 B2 | 8/2020 | El Bouayadi et al. |
| 10,769,546 B1 * | 9/2020 | Rigetti .............. H01L 21/76898 |
| 10,804,233 B1 | 10/2020 | Khandekar et al. |
| 11,139,282 B2 | 10/2021 | Ting |
| 11,171,104 B2 | 11/2021 | Nayin et al. |
| 2014/0042615 A1 | 2/2014 | Huang et al. |
| 2018/0342476 A1 | 11/2018 | Wirz |
| 2019/0181256 A1 | 6/2019 | Roberts |
| 2019/0273197 A1 | 9/2019 | Roberts |
| 2020/0176409 A1 | 6/2020 | Lucero |
| 2020/0258003 A1 | 8/2020 | Rigetti |
| 2020/0401924 A1 | 12/2020 | Paik et al. |
| 2021/0305958 A1 | 9/2021 | Hassel |
| 2021/0407939 A1 | 12/2021 | Sun et al. |
| 2022/0020715 A1 | 1/2022 | Lewandowski |

FOREIGN PATENT DOCUMENTS

| | | |
|---|---|---|
| JP | 2021072351 A | 5/2021 |
| TW | 201931543 A | 8/2019 |
| TW | 1713170 B | 12/2020 |
| TW | 202205159 A | 2/2022 |

OTHER PUBLICATIONS

International Search Report and Written Opinion issued Aug. 1, 2023 in related application No. PCT/IB2023/054688, 13 pgs.

International Search Report and Written Opinion issued Jul. 27, 2023 in related application No. PCT/IB2023/054686, 14 pgs.

List of IBM Patents or Patent Applications Treated as Related; 2 pgs.

Hillman, C., "The Benefits and Risks of Copper Pillar Bumped Flip Chips"; download from www.us-tech.com (2017); 3 pgs.

Li. X et al., "Vacuum-gap transmon qubits realized using flip-chip technology"; Applied Physics Letters (2021); vol. 119:18, 9 pgs.

O'Brien, W. et al., "Superconducting caps for quantum integrated circuits"; arXiv preprint arXiv:1708.02219 (2017); 4 pgs.

\* cited by examiner

DOWNSTOP AND BUMP BONDS FORMATION ON SUBSTRATES

BACKGROUND

Technical Field

The present disclosure generally relates to flip chip bonding, and more particularly to bonding that can support qubit devices.

Description of the Related Art

Flip-chip bonding is commonly used in the assembly of electronic devices. Bump bonds are placed on one of two chips according to various methods, then the chips are joined together by cold compression or by reflow bonding. The gap between the chips is determined by either the force of the bonding, the geometry of the bumps and the underlying metallurgy, or by the use of a rigid downstop. The rigid downstop is typically fabricated in a single step, e.g., by depositing some other material, or by etching into the substrate to produce a step having a precise height. When two chips are joined by the rigid downstop, the chips are held apart from one another by the downstop. However, fabrication of the downstop may not be compatible with the other operational processes employed in the chip manufacturing process, particularly in the case of qubit structured devices. There is also a desire to reduce the complexity of the downstop fabrication.

SUMMARY

According to one embodiment, an electronic structure includes a first substrate having a first under bump metallization (UBM) region and a second UBM region formed thereon. There are one or more solder bumps on the first UBM region. A downstop formed on the second UBM region is wider, shallower and more rigid than any one of the solder bumps formed on the first UBM region. A second substrate is joined to the first substrate by the one or more solder bumps located on the first UBM region, and a height of the downstop limits a distance between at least one of the first substrate and the second substrate, or between an object and at least one of the first substrate and the second substrate. This electronic structure is less complex to assemble because of the presence of the downstop which provides a predetermined distance between the first and second substrates height to enhance the reliability of operation.

In an embodiment, the object may be an interposer arranged at a predetermined distance from at least one of the first substrate and the second substrate. The first UBM region is a contact region and the second UBM region is a downstop region, and wherein an area of the second UBM region is larger than an area of the first UBM region. The larger region of the second UBM provides for improved reflow of the solder to form the downstop. The first UBM region is smaller to enhance the formation of truncated sphere that are the bump bonds.

In an embodiment, the second substrate includes a third UBM region arranged for contact with the one or more solder bumps. The third UBM region enhances the joining of the second substrate to the upper surface of the bump bonds that are deposited on the first substrate.

In an embodiment, the solder on the first UBM region and the second UBM region is formed by one of evaporation or electroplating. Each type of deposition has advantages in use to form the solder on the first and second UBM regions.

In an embodiment, the first UBM region and the second UBM region include pads. The pads provide for enhanced connections to the substrate.

In an embodiment, the first UBM region and the second UBM region include pads etched from metal. The use of etching may enhance the forming and patterning of UBM metallurgy on the substrate.

In an embodiment, the height of the downstop and the one or more solder bumps is determined by a volume of solder deposited the first UBM region and the second UBM region, and by an area of the under-bump metallurgy for each of the first UBM region and the second UBM region. A precisely defined space may be created to control the separation of a third semiconductor chip (which may or may not be part of another pair of bonded chips) without multiple calibrations that are performed without the use of a downstop.

According to one embodiment, a method of making an electronic structure includes applying a first under bump metallization (UBM) region and a second UBM region on a first substrate. Solder is deposited on the first UBM region and the second UBM region, and is reflowed to form one or more solder bumps on the first UBM region and a downstop on the second UBM region; A second substrate is joined to the first substrate by the one or more solder bumps located on the first UBM region. A height of the downstop limits a distance between at least one of the first substrate and the second substrate, or between an object and at least one of the first substrate and the second substrate A less complex construction with a more accurately defined distance between the first and second substrates is achieved. A simultaneous construction of the downstop and the bump bonds provides for a less complicated construction than known heretofore.

In an embodiment, the one or more solder bumps in the first UBM region and the downstop in the second UBM region are formed substantially simultaneously. A more efficient construction with shortened manufacturing time results.

In an embodiment, an area of the second UBM region is larger than an area of the first UBM region. The second area of the UBM is larger to facilitate the formation of a downstop, while the first UBM region has a smaller area to facilitate formation of truncated spheres that are the bump bonds. The downstop is wider, shallower and more rigid than the bumps. The downstop serves as a mechanical downstop due to its relative incompressibility as compared with solder bumps.

In an embodiment, a third UBM region is formed on the second substrate prior to joining the second substrate to the first substrate, the third UBM region is arranged for contact with the one or more solder bumps on the first substrate. The addition of the third UBM region facilitates the joining of the second substrate to the upper part of the bump bonds arranged on the first substrate.

In an embodiment, the solder is deposited onto the first UBM region and the second UBM region by one or more of evaporation, electroplating, and/or an injection molding technique. Each of the techniques provide advantages in construction.

In an embodiment, a height of the downstop and a height of the one or more solder bumps is determined according to a volume of solder deposited the first UBM region and the second UBM region, and by an area of the under-bump metallurgy for each of the first UBM region and the second UBM region. A precise distance is obtained between the first substrate and the second substrate through the use of a downstop. Precise calibrations associated with a joining of the second substrate onto solder bumps of the first substrate may be avoided through the use of the downstop. In a case where a third object (e.g., a third substrate, a chip, an interposer) is included in the structure, the downstop also provides a precise separation of the third object of a device from the first and second substrates without precise calibrations.

In an embodiment, the one or more solder bumps are the same size. The electrical connections may be enhanced with this construction.

In an embodiment, some of the solder bumps are different sizes. The joining of the substrates may be enhanced.

In an embodiment, the depositing of solder bumps in the first UBM region and the second UBM region includes forming solder structures on a surface of substrate by deposition via a removable mold to control a solder volume. The removable mold may facilitate construction.

In an embodiment, the removable mold is a photoresist. The photoresist may enhance the construction process.

In an embodiment, the solder bumps are limited to a restricted area. This construction may enhance operation of the electronic structure by permitting more qubits to be arranged on the electronic structure.

In an embodiment, the solder bumps are the same size, and a pattern of the bumps is customized to increase a reliable contact area. Improved reliability results by this embodiment.

In an embodiment, some of the solder bumps are differently sized, and a pattern of the bumps is customized to increase a reliable contact area. Improved reliability results from this embodiment.

According to one embodiment, an electronic structure includes a first substrate having a first under bump metallization (UBM) region with one or more solder bumps thereon, and a second UBM region. A downstop is formed on the second UBM region, the downstop having a surface area larger than a surface area of the one or more solder bumps. A second substrate is joined to the first substrate by the one or more solder bumps located on the first UBM region. The downstop has a height configured to limit a distance between at least one of the first substrate and the second substrate, or between an object and at least one of the first substrate and the second substrate. This electronic structure is less complex to assemble because of the presence of the downstop which provides a predetermined distance between the first and second substrates height to enhance the reliability of operation.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1B:
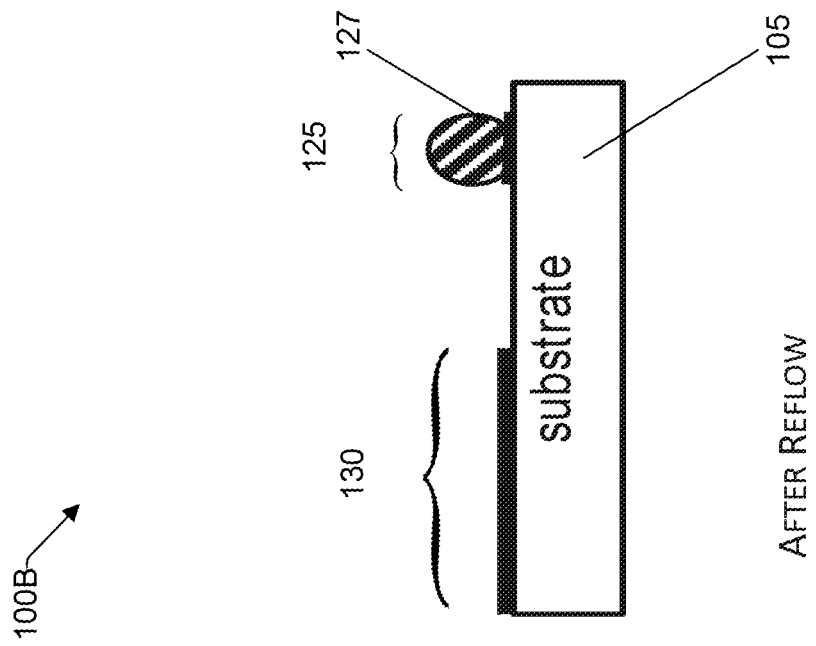
FIGS. 1A and 1B respectively illustrate substrate preparation including after-solder patterning and after reflow of solder, consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

In discussing the present technology, it may be helpful to describe various salient terms. In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. As used herein, the term "mechanically tolerant" relates to electrical properties not being significantly affected by the mechanical alignment between subject components.

As used herein, certain terms are used indicating what may be considered an idealized behavior, such as "lossless," "superconductor," "superconducting," "absolute zero,"

which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to flip chip bonding that can, for example, support connecting qubit devices. Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The ability to include more superconducting qubits is salient to being able to realize the potential of quantum computers. However, it is challenging to yield quantum processors on a monolithic qubit chip that have desired qubit characteristics, such as frequency, fidelity, etc. A modular architecture comprising smaller modular units of devices that are interconnected can make it more feasible to realize a large-scale quantum processor. However, such modular architecture may involve connections between qubits on separate physical chips and/or supporting circuitry for the qubit chip. Various quantum phenomena, such as superposition and entanglement, do not have analogs in the world of classical computing and therefore may involve special structures, techniques, and materials in order to assemble electronic devices that may operate in a cryogenic environment.

In one aspect, the teachings herein are based on the inventors' insight that directly applying conventional integrated circuit techniques for interacting with computing elements to superconducting quantum circuits may not be effective because of the unique challenges presented by quantum circuits that are not presented in classical computing architectures. Indeed, many of the systems and architectures discussed herein are operated in a cryogenic environment and may involve superconductivity. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for connecting components of a quantum computer. The techniques described herein may be implemented in a number of ways. Example implementations are provided below with reference to the following figures.

Example Architecture

Figure 1A:
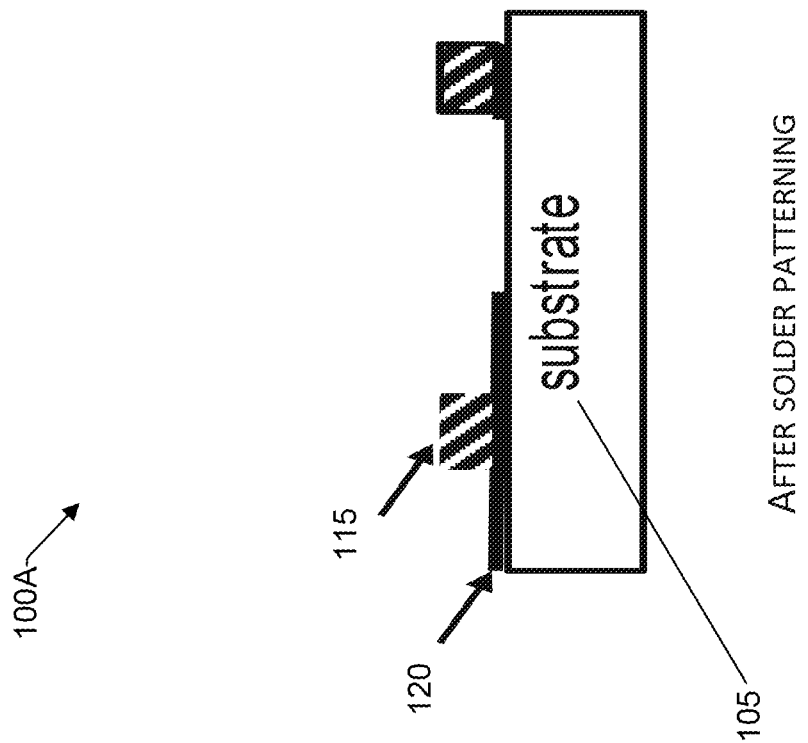

FIGS. 1A and 1B illustrate substrate preparation including after-solder patterning 100a and after reflow of solder 100B, respectively, consistent with an illustrative embodiment. A substrate 105 is prepared with under-bump metallization (UBM) 120. The UBM is provides an electrical connect from the substrate to a solder bump (or bumps). For example, the UBM 120 may provide a wetting surface for the solder. Two regions are defined-one for an electrical contact 125 and a second for standoff region(s) 130. Solder 115 is deposited onto the wafer, defined by lithography. The solder 115 is reflowed above its melting temperature of the solder, and the reflowed the solder wets the UBM surface 120. The UBM pattern in the standoff region(s) 130 are larger than in the contact region 125.

As shown in FIG. 1B, the reflow will cause the solder to form a truncated sphere in the contact region 130. The standoff region 130, due to its size, causes a substantially flat region to be formed after the solder is reflowed. The difference between the 'solder bumps' and the 'downstop' as discussed herein lies in the amount of solder deposited on each and the physical size (e.g., area) of the downstop UBM vs the bump UBM. Comparatively, the standoffs are wider and shallower than the bumps. On the other hand, the bumps are taller compared to its width, leaving room for the solder material to ooze sideways. By a construction in which the standoffs are wider and shallower than the bumps, they do not (or barely) move when pressed, thereby retaining a relatively constant height. Thus, the standoff height is controllable (by the dimensions used such as discussed in this paragraph). As the standoff is relatively more rigid than the bump, the standoff may act as a height controller. It is to be understood that not only may the standoffs be used as a height controller for the first and second substrates, but the standoffs may provide a precise distance of separation for a third object from the first and second substrates. One such example of a third object may be an interposer that can provide a connection to other chips.

After reflow, the solder on the reflow portions of the standoff region 130 is lower in height than in the contact regions. Note that both the amount of solder on the contact and standoff regions can be different by design, and the UBM dimensions may also have different sizes (e.g., area). The relation between the solder volume and surface area of the UBM can lead to a defined profile and therefore a certain height of the reflowed solder. When a second chip is placed in position on the bumps, there is formed a defined gap with the downstop. The height of the solder bump for bonding is therefore controllable and can be quite different than the height of the downstop. In one embodiment, the well-reflowed standoff can be substantially incompressible due to its high aspect ratio. By not cleaning the downstop after preparation, it may not bond well to anything. For example, if the second chip surface is chosen to be terminated by a non-bondable material such as bare silicon, or silicon oxide, it may just be held off without bonding. More solder and less area of UBM results in a more spherically shaped bump, which is higher than the downstop. Less solder and/or larger UBM results in a lower and flatter downstop.

Additional features of the method and device of the present disclosure are disclosed herein.

Example Embodiments

Figure 2:
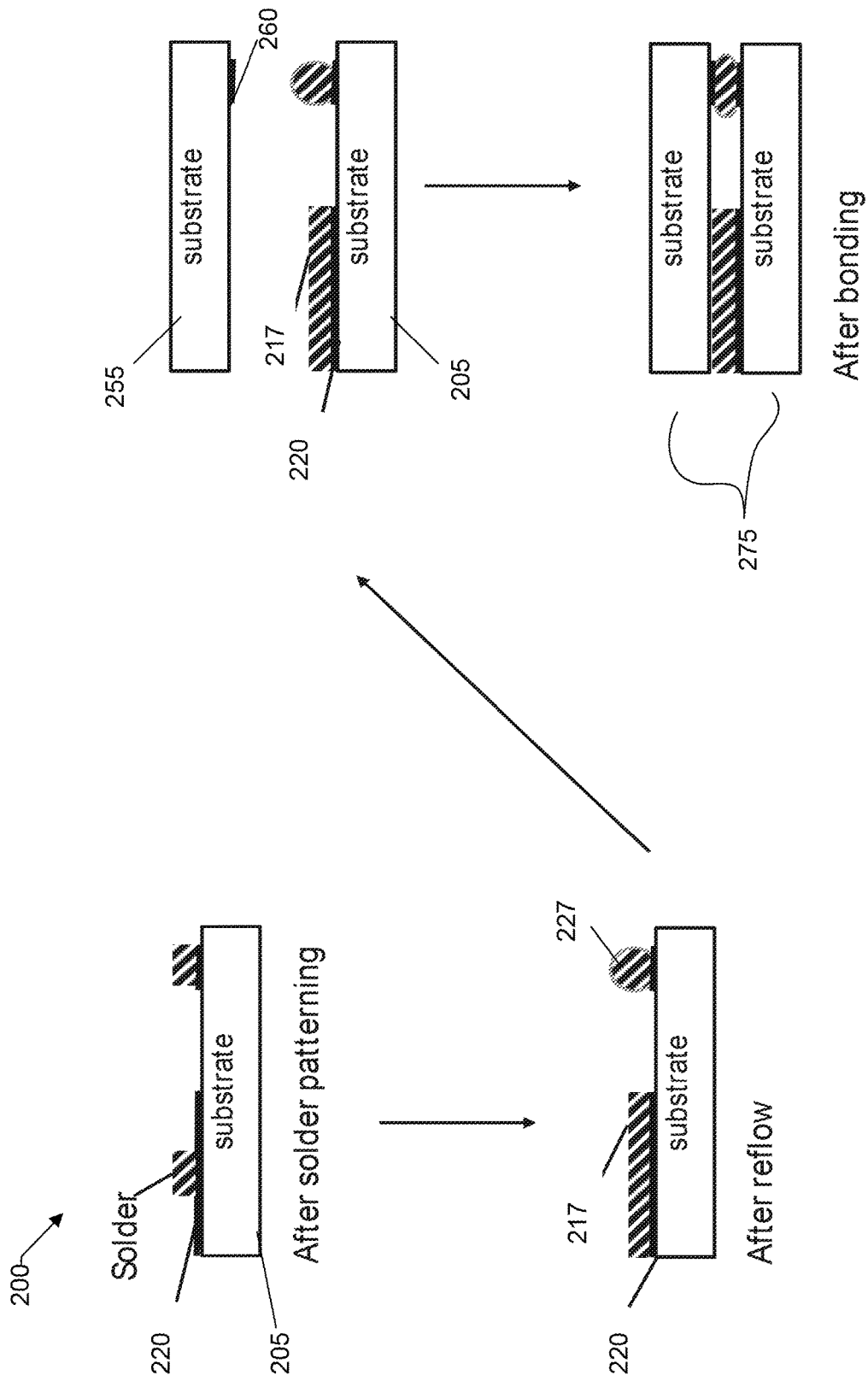
FIG. 2 illustrates an example application using standoff to control a chip gap and to form a bump bond, consistent with an illustrative embodiment.

FIG. 2 illustrates an example application 200 using a standoff region to control a chip gap and to form a bump bond, consistent with an illustrative embodiment. The after solder patterning on a first substrate 205 with solder 215 on UBM 220 and the after reflow formation of the truncated sphere forming bump bond 227 is the same as shown in FIGS. 1A and 1B.

A second substrate 255 having a UBM 260 to be connected to the bump bond 227 is pressed onto the bump bond 227. Although the bump bond 227 is compressed by the second substrate 255, the downstop 217 disposed on the substrate 205 serves to separate the second substrate 255 by a predetermined distance from the first substrate 205. This construction can prevent the bump bond 227 from being compressed to the point where it is damaged or the bump bond 227 causes a short circuit on the substrate 205.

The UBM pattern in the standoff regions are larger than in the contact region, and after reflow the solder on the reflow portions is lower in height than in the contact regions. In other words, the area for solder is wider and shallower in the standoff regions than in the contract regions. Note that both the amount of solder on the contact and standoff regions can be different by design, and the UBM dimensions can also be of different size (area). The relation between the solder volume and surface area of the UBM will lead to a defined profile and therefore the height of the solder. When a second chip is placed in contact with the downstop it can form a defined gap. The height of the solder bump for bonding is therefore controllable and can be quite different than the height of the standoff. The well-reflowed standoff will be substantially incompressible since it has such a high aspect ratio. Without cleaning the downstop after preparation, there will not be a good bond of the downstop to anything. If the second chip surface is chosen to be terminated by a non-bondable material including bare silicon, or a silicon oxide, the chip surface may be held off without bonding.

Another advantage of a downstop arranged at a predetermined distance between the first substrate 205 and the second substrate to keep the distance between the substrates substantially uniform. A variation in the distance between the first and second substrates 205, 255 may adversely affect the performance of operational parameters of the first substrate 205.

In addition, the downstop may also control the separation of a third substrate (e.g., a chip) which may or may not be part of another pair of bonded chips.

The construction in FIG. 2 provides an advantage over previous construction where the second substrate 255 is pressed down at a predetermined amount of force toward the first substrate 205 without using a downstop. For example, the construction shown in FIG. 2 provides for a more accurate spacing between the first and second substrates 205, 255 without requiring complex calibrations to be performed when joining the substrates. The construction as shown in FIG. 2 also prevents possible damage by additional downward pressure that may be placed on the second substrate 255 by additional mechanical handling. For example, if a cap or a thermal synch were disposed on the upper surface of the second substrate 255, the downstop will prevent a variation in the gap that could occur based on the additional mechanical handling to attach the cap or the thermal synch. Moreover, it is to be understood that although the downstop 217 shown in FIG. 2 appears to be arranged in one corner or one side of the space between the first and second substrates 205, 255, there may be multiple downstops (e.g., at all four corners or other areas) between the first and second substrates 205, 255. The downstop(s) may serve to adjust for variations in planarity between the first and second substrates 205, 255.

Example Process

With the foregoing overview of the example architecture, it may be helpful now to consider a high-level discussion of an example process. To that end, FIGS. 3 and 4 are flowcharts 300, 400 illustrating method of preparing a substrate, consistent with respective illustrative embodiments.

Figure 3:
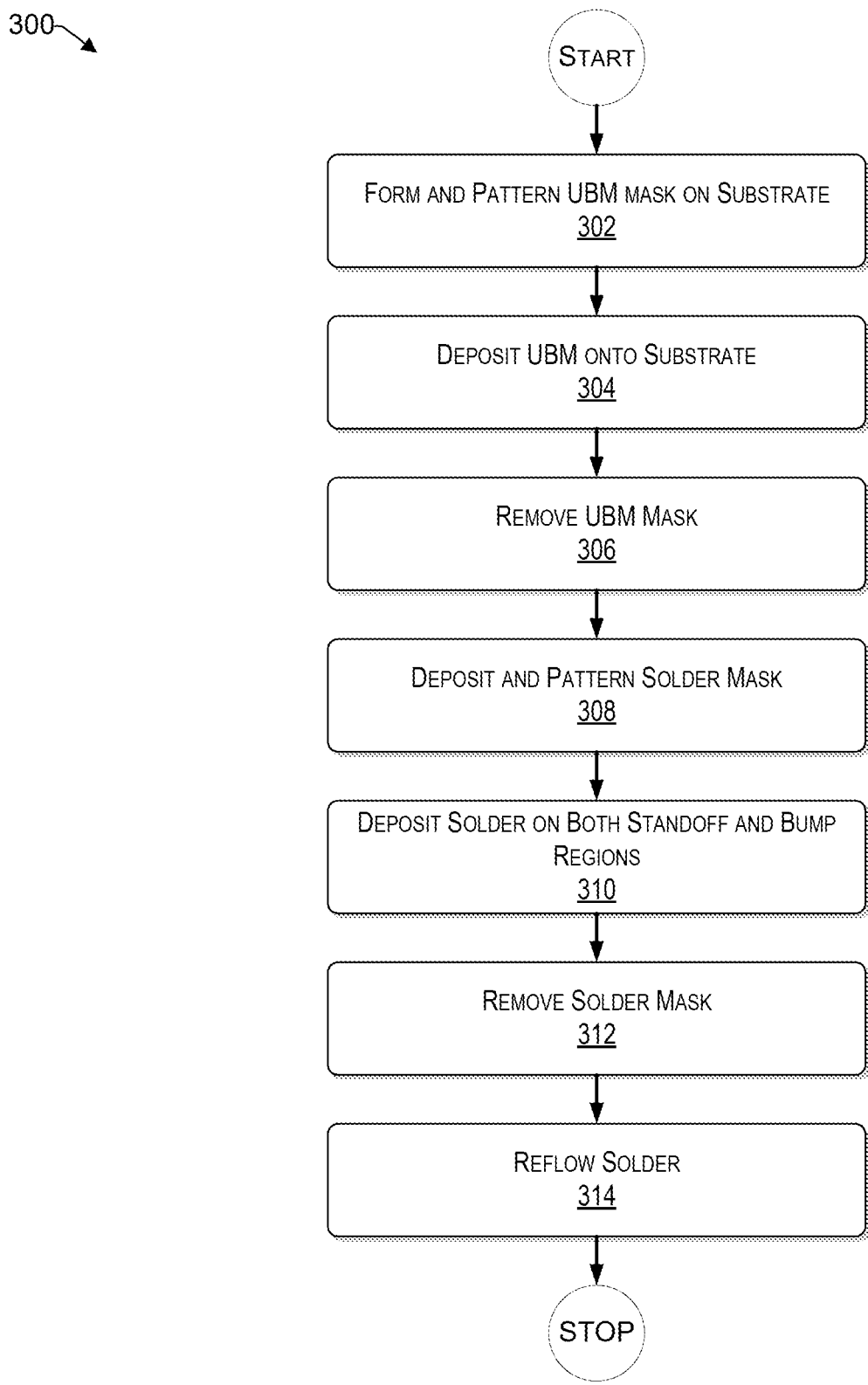
FIG. 3 is a flowchart illustrating a method for preparing a substrate with UBM by forming and patterning a UBM mask, and depositing both solder bumps and solder standoffs substantially simultaneously, consistent with an illustrative embodiment.
Figure 4:
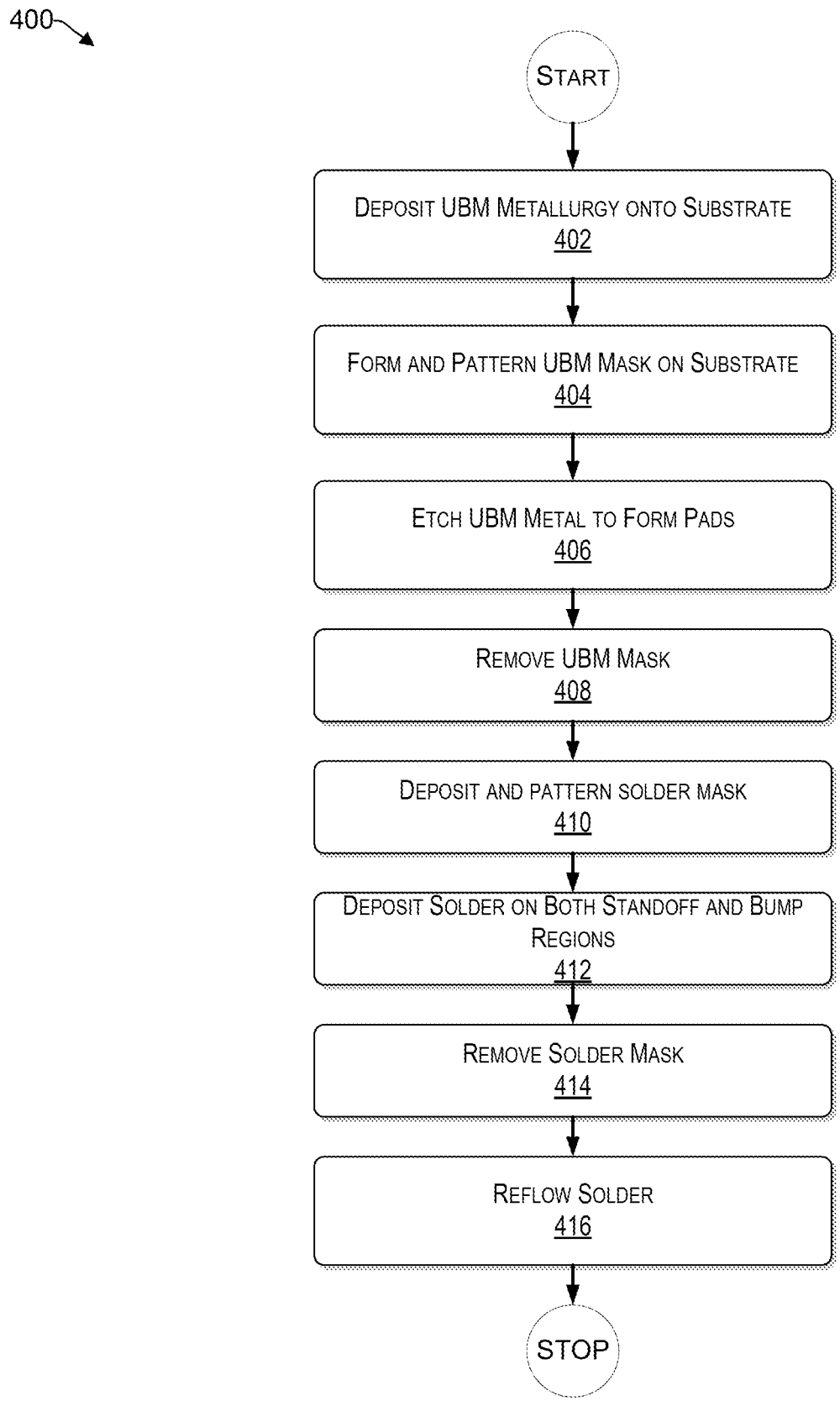
FIG. 4 is a flowchart illustrating a method for preparing a substrate with UBM by depositing UBM metallurgy onto the substrate through a patterning and etching process, consistent with an illustrative embodiment.

FIGS. 3 and 4 are shown as a collection of blocks, in a logical order, which represents a sequence of operations that can be implemented in hardware, software, or a combination thereof. In each process, the order in which the operations are described is not intended to be construed as a limitation, and any number of the described blocks can be combined in any order and/or performed in parallel to implement the process.

FIG. 3 is a flowchart illustrating a method for preparing a substrate with UBM by forming and patterning a UBM mask, and depositing both solder bumps and solder standoffs substantially simultaneously, consistent with an illustrative embodiment.

At operation 302, a UBM mask is formed and patterned on a first substrate. The UBM mask may have a contact region 130 and a standoff region 125 such as shown in FIG. 1. There may also be multiple standoff regions so as to create multiple downstops on the first substrate.

At operation 304, the UBM is deposited onto the substrate. The UBM provides a metallurgy to connect to the substrate to bump bonds. The UBM also provides a base for one or more downstops.

At operation 306, the UBM mask is removed leaving a UBM pattern on the first substrate. The standoff region 125 is arranged on the first substrate where the downstop will be created. The contact region 130 is an area where the bump bonds are formed.

At operation 308, a patterned solder mask is deposited on the UBM. The standoff region and the contact region may both have solder deposited and reflowed to form the downstop and bump bonds simultaneously.

At operation 310, solder is deposited on both the standoff and bump (e.g., contact) regions, such as shown in FIG. 1A. The solder mask is removed (operation 312) and the solder reflowed (operation 314). The larger area of the standoff region lends itself to the creation of the downstops with reflowed solder, whereas the contact area results in the solder forming a truncated solder ball 127 (see FIG. 1B). The solder is reflowed above its melting temperature of the solder, and the reflowed solder wets the UBM surface The process for the UBM and solder patterning, followed by solder reflow, ends at operation 314. A second substrate (e.g., see FIG. 2) may then be arranged onto the top of the bump bonds, with a spacing between the first substrate and the second substrate by the downstop. The second substrate may also have a UBM surface that is formed by a pattern to match the location of the bump bonds.

FIG. 4 is a flowchart illustrating a method for preparing a substrate with UBM by depositing UBM metallurgy onto the substrate through a patterning and etching process, consistent with an illustrative embodiment.

At operation 402, UBM metallurgy is deposited on a substrate, and at operation 404, a |UBM mask is formed and patterned on the substrate. The UBM mask is used to create a standoff region and a contact region for bump bonds.

At operation 406, the UBM metal is etched to formed pads. The pads may provide electrical connections from the substrate to the bump bonds.

At operation 408, the UBM mask is removed. At operation 410, solder mask is pattern deposited on the UBM. The solder provides the material for both the downstop and the bump bonds, which may be created simultaneously.

At operation 412, the solder is deposited on both the standoff and contact regions. The area of the standoff region may have a larger area than the area of the contact region(s).

At operation 414, the solder mask is removed and then at operation 416, the solder is reflowed to form one or more downstops in the standoff region, and bump bonds in the contact region. A second substrate having a UBM area may then be attached to the opposite part of the bump bonds, with the downstops acting as a spacer of a predetermined distance between the two substrates.

With regard to the methods described above in the flowcharts of FIGS. 3 and 4, these embodiments are not exhaustive of the scope of the disclosure. For example, the methods may include one or more operations in addition to, or in lieu of, other operations. For example, the one or more solder bumps may have the same size, or some of the solder bumps may have different sizes. In addition, the depositing of solder bumps in the first UBM region and the second UBM region may include forming solder structures on a surface of the substrate by deposition via a removable mold to control a solder volume. The removable mold may be a photoresist. The solder bumps may be limited to a restricted area of the substrate. A pattern of the bumps may be customized to increase a reliable contact area. The aforementioned operations is not exhaustive of method operations that may be performed to make the electronic structure as shown and described herein.

Example Computer Platform

Figure 5:
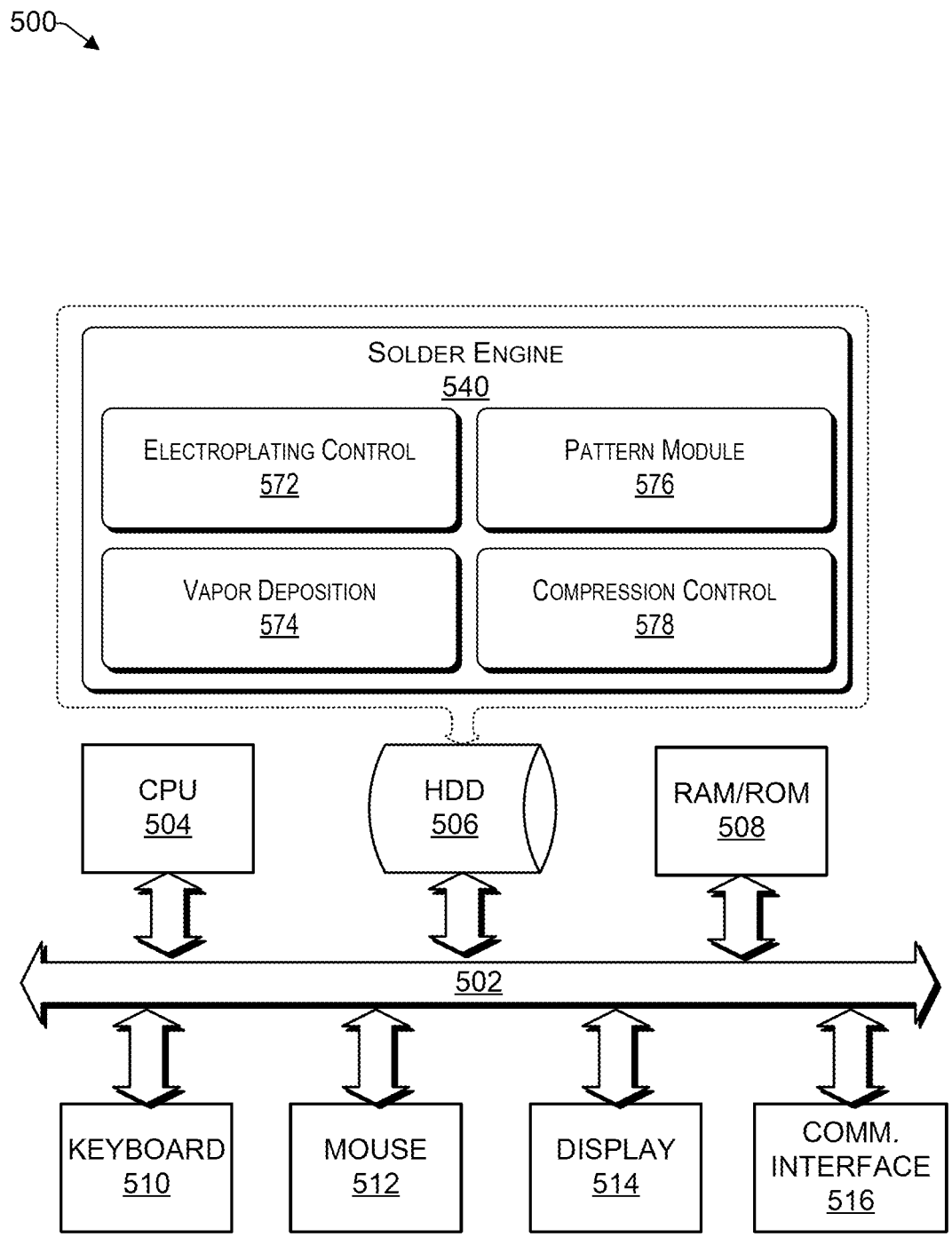
FIG. 5 is a particularly configured computing device that is operative to perform one or more of the functions described herein, consistent with an illustrative embodiment.

As discussed above, functions relating to controlling actions, including creating a substrate comprising both solder bumps and solder downstops can be performed with the use of one or more computing devices. FIG. 5 provides a functional block diagram illustration of a computer hardware platform 500 that can be used to implement a particularly configured computing device that can host a Solder engine 540. In particular, FIG. 5 illustrates a network or host computer platform 500, as may be used to implement an appropriately configured server.

The computer platform 500 may include a central processing unit (CPU) 504, a hard disk drive (HDD) 506, random access memory (RAM) and/or read only memory (ROM) 508, a keyboard 510, a mouse 512, a display 514, and a communication interface 516, which are connected to a system bus 502.

In one embodiment, the HDD 506 has capabilities that include storing a program that can execute various processes, such as the Solder engine 540, in a manner described herein. The Solder engine 540 may have various modules configured to perform different functions, such those discussed in the context of figures discussed herein. For example, the Solder engine 540 may include modules such as an electroplating control module 572, a vapor deposition control module 574, pattern control module 576, some or all of which may be used to control application of the UBM regions onto the substrate and the solder arranged on the UBM regions. A compression control module 578 may be configured to control joining of the second substrate to the first substrate. The modules shown in FIG. 5 may be combined into few modules, and these modules are not exhaustive nor required for performing any particular operation.

While modules 572 to 578 are illustrated in FIG. 5 to be part of the HDD 506, in some embodiments, one or more of these modules may be implemented in the hardware of the computing device 500. For example, the modules discussed herein may be implemented in the form of partial hardware and partial software. That is, one or more of the components of the Solder engine 540 shown in FIG. 5 may be implemented in the form of electronic circuits with transistor(s), diode(s), capacitor(s), resistor(s), inductor(s), varactor(s) and/or memristor(s). In other words, the Solder engine 540 may be implemented with one or more specially-designed electronic circuits performing specific tasks and functions described herein. Artificial Intelligence modules for training and operation of the process may also be included and participate in preparation and operation of the manufacturing process.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowcharts, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. An electronic structure comprising:
a first substrate having a first under bump metallization (UBM) region and a second UBM region formed thereon;
one or more solder bumps on the first UBM region;
a downstop formed on the second UBM region that is wider, shallower and more rigid than any one of the solder bumps formed on the first UBM region; and
a second substrate joined to the first substrate by the one or more solder bumps located on the first UBM region, wherein a height of the downstop limits a distance between at least one of the first substrate and the second substrate, or between an object and at least one of the first substrate and the second substrate, wherein the height of the downstop and a height of the one or more solder bumps is based on a volume of solder deposited the first UBM region and the second UBM region, and by an area of the under-bump metallurgy for each of the first UBM region and the second UBM region.

2. The electronic structure according to claim 1, wherein:
the object comprises an interposer arranged at a predetermined distance from at least one of the first substrate and the second substrate;
the first UBM region comprises a contact region;
the second UBM region comprises a downstop region; and
an area of the second UBM region is larger than an area of the first UBM region.

3. The electronic structure according to claim 1, wherein:
the distance between the first substrate and the second substrate, or between the object and at least one of the first substrate and the second substrate, is based on a height of the second UBM region and limited by the height of the downstop; and
the second substrate includes a third UBM region arranged for contact with the one or more solder bumps.

4. An electronic structure comprising:
a first substrate having a first under bump metallization (UBM) region and a second UBM region formed thereon;
one or more solder bumps on the first UBM region;
a downstop formed on the second UBM region that is wider, shallower and more rigid than any one of the solder bumps formed on the first UBM region; and
a second substrate joined to the first substrate by the one or more solder bumps located on the first UBM region, wherein a height of the downstop limits a distance between at least one of the first substrate and the second substrate, or between an object and at least one of the first substrate and the second substrate, wherein the solder on the first UBM region and the second UBM region is formed by at least one of evaporation or electroplating.

5. The electronic structure according to claim 2, wherein the first UBM region and the second UBM region on the first substrate comprise pads.

6. The electronic structure according to claim 2, wherein the first UBM region and the second UBM region comprise pads etched from metal.

7. The electronic structure according to claim 1, wherein the one or more solder bumps have a same size.

8. The electronic structure according to claim 1, wherein at least some of the solder bumps comprise different sizes.

9. An electronic structure comprising:
a first substrate having a first under bump metallization (UBM) region with one or more solder bumps thereon, and a second UBM region;
a second substrate joined to the first substrate by the one or more solder bumps located on the first UBM region;
a downstop formed on the second UBM region, the downstop having a surface area larger than a surface area of the one or more solder bumps, and a height configured to limit a distance between at least one of the first substrate and the second substrate, or between an object and at least one of the first substrate and the second substrate, wherein the height of the downstop and a height of the one or more solder bumps is based on a volume of solder deposited the first UBM region and the second UBM region, and by an area of the under-bump metallurgy for each of the first UBM region and the second UBM region.

10. A method of making an electronic structure, comprising:
applying a first under bump metallization (UBM) region and a second UBM region on a first substrate;
depositing solder on the first UBM region and the second UBM region;
reflowing the deposited solder and forming one or more solder bumps on the first UBM region and a downstop on the second UBM region; and
joining a second substrate to the first substrate by the one or more solder bumps located on the first UBM region, wherein:
a distance between at least one of the first substrate and the second substrate, or between an object and at least one of the first substrate and the second substrate, is based on a height of the second UBM region and limited by a height of the downstop, and
the height of the downstop and a height of the one or more solder bumps is based on a volume of solder deposited the first UBM region and the second UBM region, and by an area of the under-bump metallurgy for each of the first UBM region and the second UBM region.

11. The method according to claim 10, wherein the one or more solder bumps in the first UBM region and the downstop in the second UBM region are formed substantially simultaneously.

12. The method according to claim 10, wherein an area of the second UBM region is larger than an area of the first UBM region.

13. The method according to claim 10, further comprising:
forming a third UBM region on the second substrate prior to joining the second substrate to the first substrate; and
arranging the third UBM region for contact with the one or more solder bumps on the first substrate.

14. The method according to claim 10, wherein a solder of the solder bumps of the first and second UBM regions is deposited onto the first UBM region and the second UBM region by one or more of evaporation, electroplating, and/or an injection molding technique.

15. The method according to claim 10, wherein the first UBM region and the second UBM region deposited on the first substrate each comprise pads.

16. The method according to claim 10, wherein the applying of the first UBM region and the second UBM region on the first substrate includes etching pads from metal.

17. The method according to claim 10, wherein the one or more solder bumps located on the first UBM region have a same size.

18. The method according to claim 10, wherein some of the solder bumps of the first UBM region are different sizes.

19. The method according to claim 10, wherein the depositing of solder bumps in the first UBM region and the second UBM region includes forming solder structures on a surface of the first substrate by deposition via a removable mold to control a solder volume.

20. The method according to claim 10, wherein the removable mold comprises a photoresist.

21. The method according to claim 10, wherein the solder bumps of the first UBM region are limited to a restricted area.

* * * * *